United States Patent
Lee et al.

(10) Patent No.: US 11,799,552 B2
(45) Date of Patent: Oct. 24, 2023

(54) OPTICAL NETWORK USING OPTICAL AMPLIFIER IN GAIN SATURATION REGION

(71) Applicant: ELECTRONICS AND TELECOMMUNICATIONS RESEARCH INSTITUTE, Daejeon (KR)

(72) Inventors: Han Hyub Lee, Daejeon (KR); Hwan Seok Chung, Daejeon (KR)

(73) Assignee: ELECTRONICS AND TELECOMMUNICATIONS RESEARCH INSTITUTE, Daejeon (KR)

(*) Notice: Subject to any disclaimer, the term of this patent is extended or adjusted under 35 U.S.C. 154(b) by 0 days.

(21) Appl. No.: 17/394,735

(22) Filed: Aug. 5, 2021

(65) Prior Publication Data
US 2022/0045787 A1   Feb. 10, 2022

(30) Foreign Application Priority Data

Aug. 6, 2020  (KR) .................. 10-2020-0098648
Feb. 17, 2021  (KR) .................. 10-2021-0021110

(51) Int. Cl.
*H04B 10/50*   (2013.01)
*H04B 10/079*   (2013.01)
(Continued)

(52) U.S. Cl.
CPC ....... *H04B 10/50* (2013.01); *H04B 10/07955* (2013.01); *H04B 10/69* (2013.01);
(Continued)

(58) Field of Classification Search
CPC ... H04L 1/0061; H04L 1/0042; H01S 5/0617; H01S 2301/02; H01S 5/0683; H01S 5/50;
(Continued)

(56) References Cited

U.S. PATENT DOCUMENTS 5,500,756 A * 3/1996 Tsushima ........... H04Q 11/0478
398/37
7,092,146 B2 * 8/2006 Kim .................. G02F 2/004
359/326
(Continued)

FOREIGN PATENT DOCUMENTS

CN    102171896 A * 8/2011 ........... H01S 5/0612
JP    2011-109248 A    6/2011
(Continued)

OTHER PUBLICATIONS

Junwen Zhang et al., "Symmetrical 50-GB/s/λ PAM-4 Tdm-Pon in O-band with DSP and Semiconductor Optical Amplifier Supporting PR-30 Link Loss Budget", 2018 Optical Society of America.

*Primary Examiner* — Abbas H Alagheband
(74) *Attorney, Agent, or Firm* — LRK PATENT LAW FIRM

(57) ABSTRACT

An optical network using an optical amplifier in a gain saturation region includes an optical transmission apparatus. The optical transmission apparatus includes an optical transmitter configured to output an optical signal, a semiconductor optical amplifier (SOA) configured to amplify the optical signal outputted through the optical transmitter, and a controller configured to control the SOA to operate in a gain saturation region or a linear gain region depending on whether a forward error correction (FEC) function is used in the optical network.

7 Claims, 6 Drawing Sheets

(51) Int. Cl.
*H04B 10/69* (2013.01)
*H04L 1/00* (2006.01)
*H01S 5/06* (2006.01)

(52) U.S. Cl.
CPC ......... *H01S 5/0617* (2013.01); *H01S 2301/02* (2013.01); *H04L 1/0061* (2013.01)

(58) Field of Classification Search
CPC ... H04B 10/07955; H04B 10/50; H04B 10/69
See application file for complete search history.

(56) References Cited

U.S. PATENT DOCUMENTS

| | | | | |
|---|---|---|---|---|
| 8,259,390 | B2* | 9/2012 | Hoshi | H01S 5/50 359/341.43 |
| 8,472,110 | B2* | 6/2013 | Sone | H01S 5/50 359/344 |
| 8,736,956 | B2* | 5/2014 | Tanaka | H01S 5/50 359/344 |
| 8,749,879 | B2* | 6/2014 | Tanaka | H01S 5/0265 359/344 |
| 9,634,790 | B2* | 4/2017 | Lee | H04Q 11/0005 |
| 2002/0015199 | A1* | 2/2002 | Eder | H04J 14/0213 398/36 |
| 2002/0030877 | A1* | 3/2002 | Way | H04L 27/02 398/185 |
| 2004/0109221 | A1* | 6/2004 | Kim | H01S 5/50 359/248 |
| 2006/0222367 | A1* | 10/2006 | Onaka | H04J 14/0221 398/83 |
| 2009/0129785 | A1* | 5/2009 | Murakami | H01S 3/06754 359/337.2 |
| 2009/0169212 | A1* | 7/2009 | Onaka | H04J 14/0221 398/79 |
| 2009/0237781 | A1* | 9/2009 | Hoshi | H04B 10/296 359/344 |
| 2010/0208335 | A1* | 8/2010 | Yoshida | H01S 5/50 359/344 |
| 2010/0321768 | A1* | 12/2010 | Sone | H01S 5/50 359/344 |
| 2011/0164310 | A1* | 7/2011 | Tanaka | H01S 5/0612 359/344 |
| 2013/0011140 | A1* | 1/2013 | Xu | H04J 14/02 398/81 |
| 2016/0020867 | A1* | 1/2016 | Lee | H04Q 11/0067 398/48 |
| 2016/0149378 | A1* | 5/2016 | Kinoshita | H01S 5/0617 359/337 |
| 2021/0021338 | A1* | 1/2021 | Calabrò | H04B 10/50 |

FOREIGN PATENT DOCUMENTS

| | | | |
|---|---|---|---|
| JP | 2011109248 A | * | 6/2011 |
| JP | 5460253 B2 | * | 4/2014 |
| JP | 2018-032822 A | | 3/2018 |
| KR | 10-1034120 B1 | | 5/2011 |
| WO | 2019/003833 A1 | | 1/2019 |

* cited by examiner

OPTICAL NETWORK USING OPTICAL AMPLIFIER IN GAIN SATURATION REGION

CROSS-REFERENCE TO RELATED APPLICATIONS

This application claims the priority benefit of Korean Patent Application No. 10-2020-0098648 filed on Aug. 6, 2020, and Korean Patent Application No. 10-2021-0021110 filed on Feb. 17, 2021 in the Korean Intellectual Property Office, the disclosures of which are incorporated herein by reference for all purposes.

BACKGROUND

1. Field of the Invention

One or more example embodiments relate to an optical network using an optical amplifier in a gain saturation region, and more specifically, to a method for maximally increasing a power budget of an optical network by amplifying an optical signal, using a semiconductor optical amplifier with gain saturated in an optical transmitter of an optical transmission system used in the optical network.

2. Description of Related Art

An optical network is a technology capable of satisfying a bandwidth required to accommodate broadband access, business services, and mobile services such as mobile front haul and back haul. In particular, among optical network technologies, a time division multiplexing-passive optical network (TDM-PON), which is an optical access network technology, may provide services by connecting multiple subscribers to one optical distribution network. The TDM-PON uses one optical wavelength for each of a downlink optical signal and an uplink optical signal, thereby saving optical wavelength resources.

The optical distribution network of the TDM-PON may configure a remote node using a simple optical power distributor, and thus it is possible to conveniently configure multiple remote nodes along the optical distribution network to provide an optical connection to a user. In order to build the optical distribution network that provides multiple remote nodes in this manner, the TDM-PON needs to have a large power budget.

Recently, as a transmission speed of an optical signal for the TDM-PON increases from several Gb/s to several tens of Gb/s, the use of a multi-level modulation scheme as well as an existing NRZ modulation scheme is being considered. An increase in a signal speed and the application of a complex modulation scheme results in a limited optical output of an optical transmitter and a low reception sensitivity of an optical receiver used for an optical transmission system, and thus it becomes important to secure the power budget of the TDM-PON.

In order to increase the power budget, a technology may be used for amplifying an optical signal outputted from the optical transmitter using an optical amplifier, or amplifying the optical signal using an optical amplifier at a front end of the optical receiver, and then receiving an input through the optical receiver. Optical amplifiers are classified according to a type of optical amplification medium, and divided into an optical fiber optical amplifier and a semiconductor optical amplifier (SOA).

A wavelength of 1300 nm, which does not require chromatic dispersion compensation, is standardized and used as a wavelength of a recent optical signal for the TDM-PON. An increase in signal speed results in an increase in the effect of chromatic dispersion, and accordingly the wavelength of 1300 nm will be preferred in the future.

A thulium-doped fiber amplifier (TDFA) has been developed for the wavelength of 1300 nm. However, there are short-comings in that the TDFA is bulky and consumes a lot of power. Conversely, the SOA is small in volume and is easily coupled to an optical transceiver, and thus the SOA is preferred for optical access.

In the SOA, the output optical signal increases as an input optical signal is large, and thus, a high-output signal may be obtained only by making an input as large as possible. However, when the input is large, the gain of the SOA may be saturated, and the distortion of the amplified optical signal and additional noise may occur due to fast dynamic characteristics of a semiconductor, which is a gain medium of the SOA. In order to prevent such problems, an input light power is lowered so that the gain of the SOA is not saturated, and thus the SOA may be used in a linear gain region in which the gain is not saturated. However, when the SOA is used in the linear gain region, the SOA has a limited output.

FIG. 1 illustrates a gain curve based on an input of an SOA. In general, an input power of the SOA is determined in a linear region, and accordingly, an input condition according to FIG. 1 is about −7.5 dBm. Here, an output is 11 dBm. When an input of the SOA is used in a gain saturation region (linear region), an input signal may be increased up to 5 dBm. Here, an optical output of the SOA is 15 dBm, and an output power increase of 4 dB may be obtained. Therefore, when the output of an optical signal is increased using the SOA, it is effective to operate the SOA in the gain saturation region, if possible.

A recent optical transmission system is provided with a forward error correction (FEC) function. Thus, even when a received signal is degraded, the recent optical transmission system may correct an error within a performance range of the FEC to output the error in an error-free state. The FEC is a scheme of correcting an error by adding a bit for error correction to data to be transmitted from an optical transmitter, and performing, by a signal reception side, a data error detection process.

Therefore, considering that the FEC may be used in the optical transmission system as described above, even when an optical signal is distorted by operating the SOA in the gain saturation region, the effect of increasing an optical signal power with the SOA may be obtained when a signal error is in a range that is correctable with the FEC. However, the FEC has a limited performance, and thus it is necessary to keep the gain saturation of the SOA constant in a fixed state.

SUMMARY

Example embodiments provide an apparatus and method for allowing a semiconductor optical amplifier (SOA) used in an optical network to operate in a gain saturation region or a linear gain region depending on whether a forward error correction (FEC) function is used, to determine whether gain of the SOA is saturated or not, and to maintain a predetermined operating state.

In addition, example embodiments provide an apparatus and method for allowing an output optical signal power when an SOA operates in a gain saturation region to be greater than an output optical signal power when the SOA operates in a linear gain region.

In addition, example embodiments provide an apparatus and method capable of calculating gain saturation of an SOA in order to operate the SOA in a gain saturation region, and optimizing an operating condition of the SOA through a feedback process based on the calculated gain saturation to increase an optical output of the SOA, thereby maximally increasing a power budget of an optical network.

According to an aspect, there is provided an optical network including an optical transmission apparatus. The optical transmission apparatus may include an optical transmitter configured to output an optical signal, a semiconductor optical amplifier (SOA) configured to amplify the optical signal outputted through the optical transmitter, and a controller configured to control the SOA to operate in a gain saturation region or a linear gain region depending on whether a forward error correction (FEC) function is used in the optical network.

The controller may be configured to control the SOA to operate in the gain saturation region when the FEC function is used in the optical network, and to control the SOA to operate in the linear gain region when the FEC function is not used in the optical network.

The controller may be configured to control an optical output of the optical transmitter and an operating condition of the SOA based on gain saturation of the SOA, and the gain saturation of the SOA may be determined based on amplified spontaneous emission (ASE) noise of the SOA.

According to another aspect, there is provided an optical network including an optical transmission apparatus. The optical transmission apparatus may include an optical transmitter configured to output an optical signal, an SOA configured to amplify the optical signal outputted through the optical transmitter, and a controller configured to control an optical output of the optical transmitter and an operating condition of the SOA based on gain saturation of the SOA. The gain saturation of the SOA may be determined based on ASE noise of the SOA.

The controller may include a first optical power meter configured to measure an optical power of a first optical signal outputted by distributing, through an optical distributer, the optical signal amplified through the SOA to include the ASE noise, an optical filter configured to filter a second optical signal other than the first optical signal outputted through the optical distributer, a second optical power meter configured to measure an optical power of the second optical signal from which the ASE noise is filtered by the optical filter, and a processor configured to determine the gain saturation of the SOA using the first optical power measured through the first optical power meter and the second optical power measured through the second optical power meter.

The gain saturation of the SOA may be determined using a difference between the first optical power and the second optical power.

The controller may be configured to increase the optical output of the optical transmitter or decrease an operating current of the SOA when the determined gain saturation of the SOA has a value greater than or equal to a preset value.

The controller may be configured to decrease the optical output of the optical transmitter or increase an operating current of the SOA when the determined gain saturation of the SOA has a value less than a preset value.

The controller may be configured to control the optical output of the optical transmitter and the operating condition of the SOA according to the determined gain saturation of the SOA using a feedback loop or a look-up table.

According to still another aspect, there is provided an optical transmission method in an optical network, the method including distributing an optical signal including ASE noise outputted by an optical transmitter and amplified through an SOA using a first optical distributer, distributing a partial output of the first optical distributer using a second optical distributer, measuring a first optical power of a first optical signal outputted through the second optical distributer to include the ASE noise, filtering a second optical signal outputted through the second optical distributer using an optical filter, measuring a second optical power of the second optical signal from which the ASE noise is filtered by the optical filter, and determining gain saturation of the SOA using the first optical power and the second optical power.

The gain saturation of the SOA may be determined using a difference between the first optical power and the second optical power.

The method may further include controlling an optical output of the optical transmitter and an operating condition of the SOA based on the determined gain saturation of the SOA.

The controlling may include increasing the optical output of the optical transmitter or decreasing an operating current of the SOA when the determined gain saturation of the SOA has a value greater than or equal to a preset value.

The controlling may include decreasing the optical output of the optical transmitter or increasing an operating current of the SOA when the determined gain saturation of the SOA has a value less than a preset value.

The controlling may include controlling the optical output of the optical transmitter and the operating condition of the SOA according to the determined gain saturation of the SOA using a feedback loop or a look-up table.

Additional aspects of example embodiments will be set forth in part in the description which follows and, in part, will be apparent from the description, or may be learned by practice of the disclosure.

According to example embodiments, the power budget of the optical network may be maximally increased by calculating the gain saturation of the SOA, and optimizing the operating condition of the SOA and the output of the optical transmitter based on the calculated gain saturation.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

Hereinafter, example embodiments will be described in detail with reference to the accompanying drawings.

Figure 1:
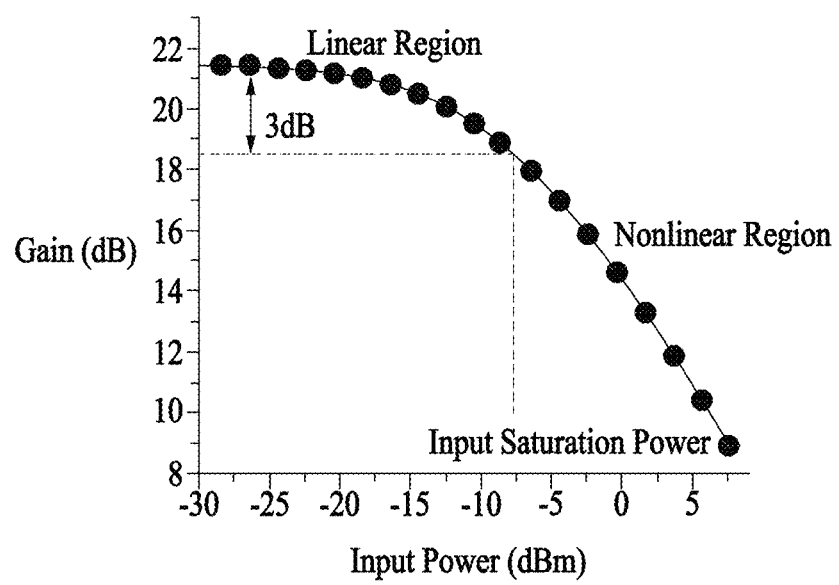
FIG. 1 is a diagram illustrating gain characteristics according to an input power of a semiconductor optical amplifier (SOA)
Figure 2:
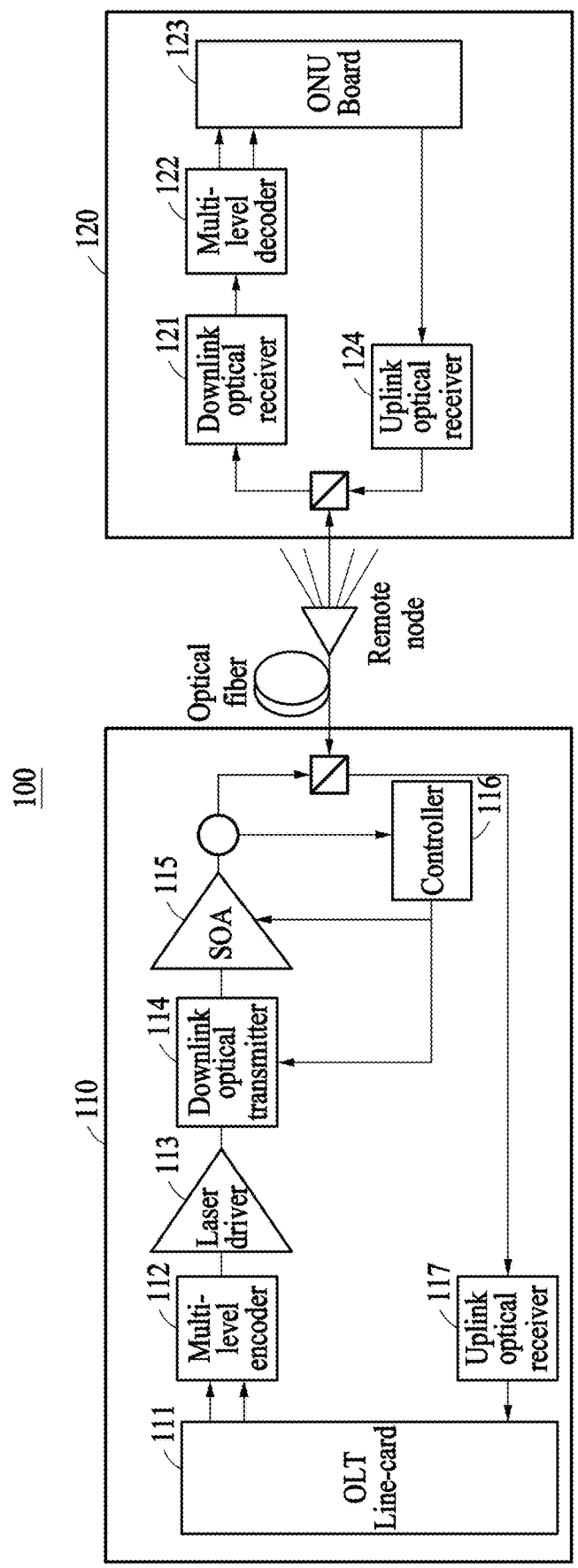
FIG. 2 is a diagram illustrating a structure of an optical network according to an example embodiment.

FIG. 2 is a diagram illustrating a structure of an optical network according to an example embodiment.

Referring to FIG. 2, an optical network 100 according to example embodiments may have a high-speed time division multiplexing-passive optical network (TDM-PON) structure. However, the optical network 100 is not limited to the above example, but may have various structures such as a wavelength division multiplexing-passive optical network (WDM-PON), a point-to-point optical access network, and the like.

First, an optical line terminal (OLT) 110 constituting the optical network 100 may include an OLT-line-card 111, a multi-level encoder 112, a laser driver 113, and a downlink optical transmitter. 114, a semiconductor optical amplifier (SOA) 115 used to amplify a downlink optical signal, and a controller 116 that monitors an output of the SOA 115 and controls operating conditions of the downlink optical transmitter 114 and the SOA 115. In addition, the OLT 110 may include an uplink optical receiver 117 so as to additionally receive an uplink optical signal.

An optical network unit (ONU) 120 constituting the optical network 100 may include a downlink optical receiver 121 capable of receiving a downlink optical signal transmitted from the OLT 110, a multi-level decoder 122 that decodes the received downlink optical signal, an ONU board 123 that receives the decoded downlink optical signal and outputs an uplink optical signal, and an uplink optical transmitter 124 that transmits the uplink optical signal outputted from the ONU board 123 to the OLT 110.

An optical transmission apparatus such as the OLT 110 and the ONU 120 constituting the optical network 100 may include a forward error correction (FEC) function. The optical transmission apparatus may control the SOA 115 to operate in a gain saturation region or a linear gain region depending on whether the FEC function is used.

For example, the controller 116 of the OLT 110 may control the SOA 115 to operate in the gain saturation region when the FEC function is used in the transmission apparatus, and may control the SOA 115 to operate in the linear gain region when the FEC function is not used. Hereinafter, a method for controlling the SOA 115 to operate in the gain saturation region will be described.

Figure 3:
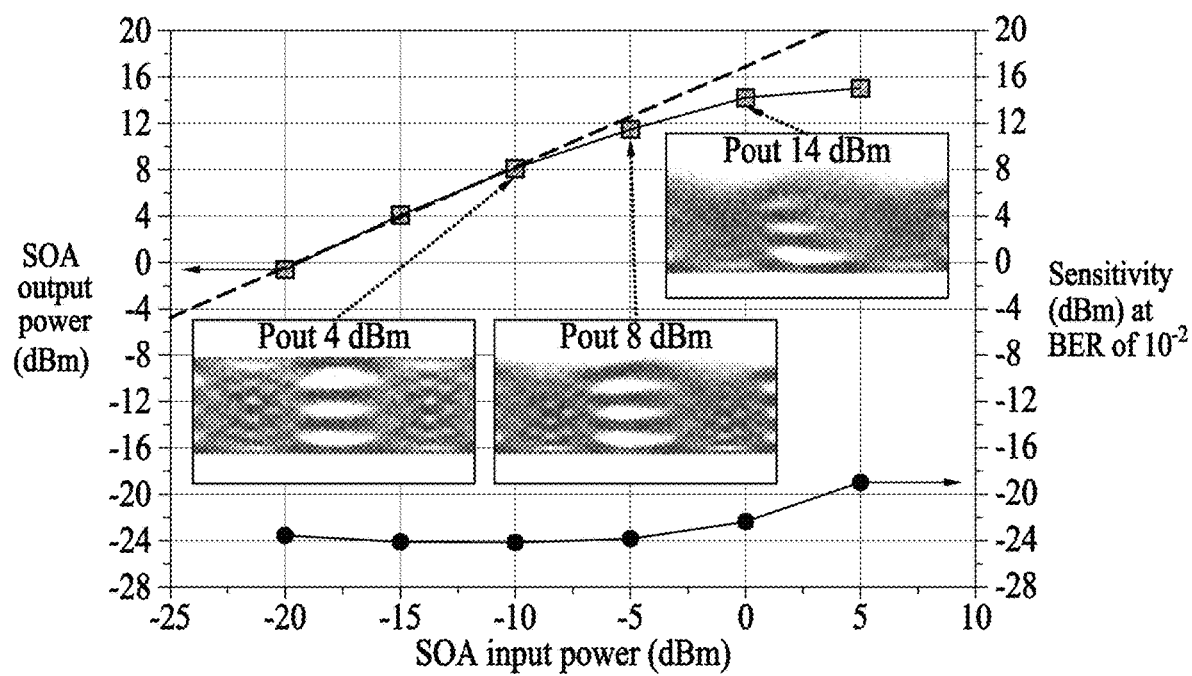
FIG. 3 is a diagram illustrating an output and an eye diagram of an SOA based on an optical power of an input optical signal according to an example embodiment.

When the SOA 115 is used to amplify the downlink optical signal in the same manner as the OLT 110 according to example embodiments, an increase in an optical power of an input optical signal for increasing an output of the SOA 115 may cause a gain saturation phenomenon of the SOA 115, and an eye diagram of an output optical signal may be distorted by the gain saturation phenomenon, as illustrated in FIG. 3.

According to the measurement result of FIG. 3, it can be seen that the eye diagram of the output optical signal is degraded as the optical power of the input optical signal inputted into the SOA 115 increases. In this case, referring to FIG. 3, as the optical power of the input optical signal increases, the optical power of the output optical signal may increase linearly. Then, with respect to the input optical signal having an optical power of −10 dBm or more, the optical power of the output optical signal may be saturated. That is, when the input optical signal of the SOA 115 increases by 0 dBm or more, an increase in a reception sensitivity may become higher than an increase in the optical power of the output optical signal, and accordingly a power budget calculated by a difference between the optical power of the output optical signal and the reception sensitivity may decrease, which is related to the gain saturation phenomenon of the SOA 115.

Therefore, in order to secure a maximum power budget of the optical network 100, it is required to monitor a gain saturation degree of the SOA 115, and control, based on the gain saturation degree, an optical power inputted into the SOA 115 and operating conditions (for example, an operating current, temperature, and the like) of the SOA 115.

However, the gain saturation degree of the SOA 115 may be measured with the eye diagram of the output optical signal, but a measuring apparatus for measuring the eye diagram is very expensive and has a large volume, so that it is difficult to mount the measuring apparatus on the optical network 100, that is, a TDM-PON system.

Therefore, example embodiments may provide a method for measuring the gain saturation degree of the SOA 115 simply by measuring the optical power of the output optical signal outputted through the SOA 115.

Figure 4:
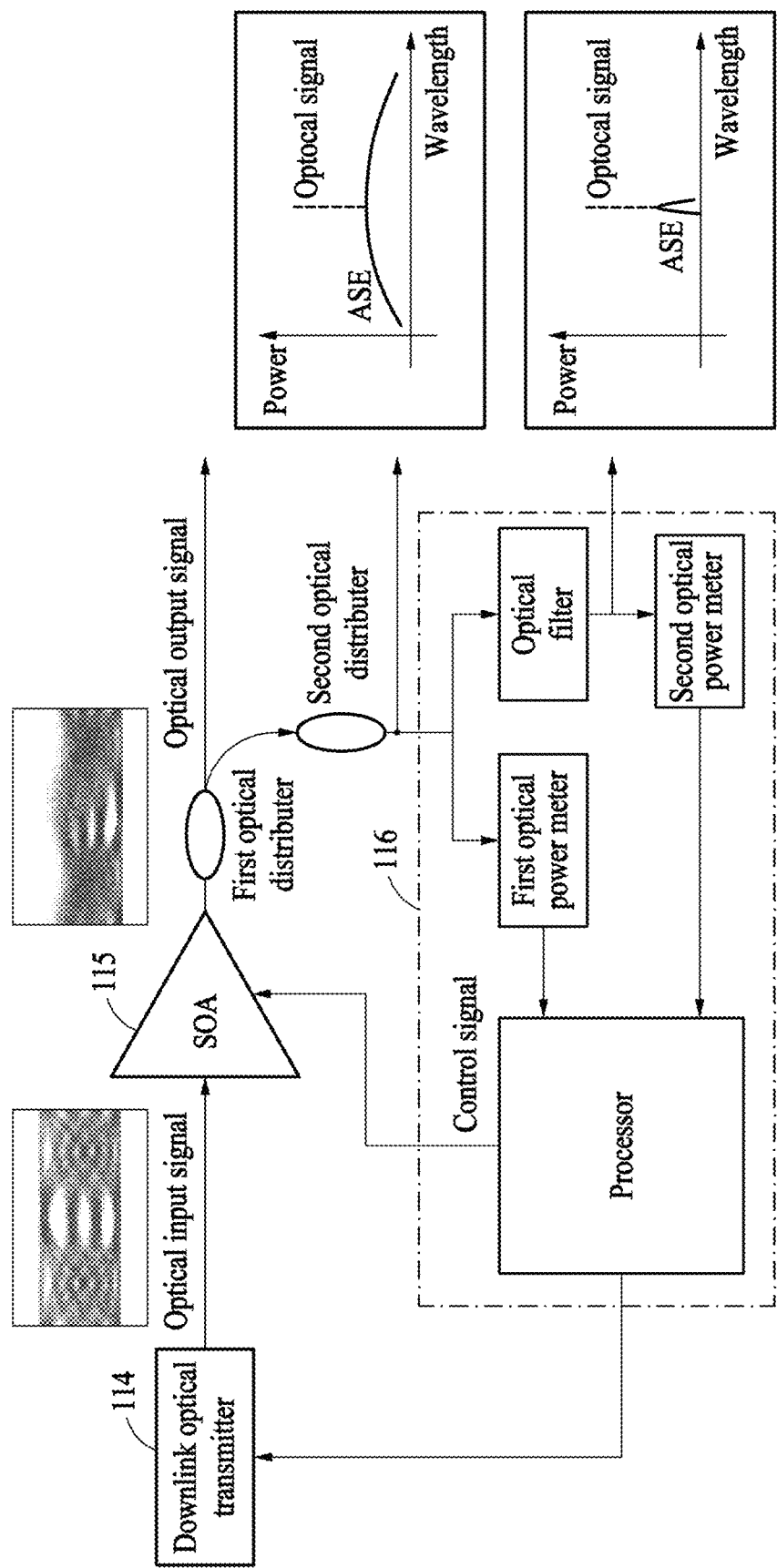
FIG. 4 is a diagram illustrating a structure of a controller constituting an optical line terminal (OLT) according to an example embodiment.

FIG. 4 is a diagram illustrating a structure of a controller constituting an OLT according to an example embodiment.

Referring to FIG. 4, in order to monitor an output optical signal of the SOA 115, a first optical distributer may be applied to an output terminal of the SOA 115 to input a portion of the output optical signal into the controller 116. In this case, an optical power loss may be minimized by making a ratio of the optical distributer as small as 1:99 or 1:9.

In this case, in the SOA 115, light may be spontaneously generated even when an optical signal is not inputted, and the generated light may be amplified and outputted in the SOA 115. The light is referred to as amplified spontaneous emission (ASE) noise, and a magnitude of the ASE noise may decrease as an optical power of the input optical signal increases. The SOA may have an optical waveguide including a gain medium therein, and the optical waveguide may generate a photon in the gain medium by electric energy supplied from the outside. When an optical signal is inputted, the photon may be converted into a form having the same characteristics as the optical signal through a stimulated emission process of the optical signal. However, in the absence of the optical signal, the photon may be spontaneously emitted over time and converted into the ASE noise.

The portion of the output optical signal inputted into the controller 116 may be separated into two signals through the second optical distributer. In this case, a first optical power meter constituting the controller 116 may receive a first optical signal among the two separated signals, measure a first optical power, and then transmit a measured value of the first optical power to a processor. In this case, the measured first optical power may have a value including an ASE noise power together with an optical signal power.

Alternatively, an optical filter constituting the controller 116 may receive a second optical signal among the two separated signals to optically filter the ASE noise. In addition, a second optical power meter disposed at a rear end of the optical filter may measure a second optical power of the second optical signal from which the ASE noise is filtered, and then may transmit a measured value of the second optical power to the processor. In this case, the measured second optical power may have a value from which the power of the ASE noise is removed.

The processor constituting the controller 116 may determine a gain saturation of the SOA 115 using the first optical power measured through the first optical power meter and the second optical power measured through the second optical power meter. More specifically, the processor may determine the gain saturation of the SOA 115 using a difference between the first optical power and the second optical power.

For example, when the second optical power from which the power of the ASE noise is removed is much less than the first optical power, which is a total power of the output optical signal, it may mean that the power of the ASE noise is large, and thus the processor may determine that the SOA 115 is not saturated. Alternatively, when the first optical power, which is a total power of the output optical signal, is similar to the second optical power from which the power of the ASE noise is removed, it may mean that the power of the ASE noise is small, and thus the processor may determine that the SOA 115 is saturated.

In this case, when the determined gain saturation of the SOA 115 has a value greater than or equal to a preset value, the processor may increase an optical output of the downlink optical transmitter 114 or decrease an operating current of the SOA 115, thereby increasing a power budget of the optical network 100.

Alternatively, when the gain saturation of the SOA 115 has a value less than a preset value, the processor may decrease the optical output of the downlink optical transmitter 114 or increase the operating current of the SOA 115, thereby increasing the power budget of the optical network 100.

Figure 5:
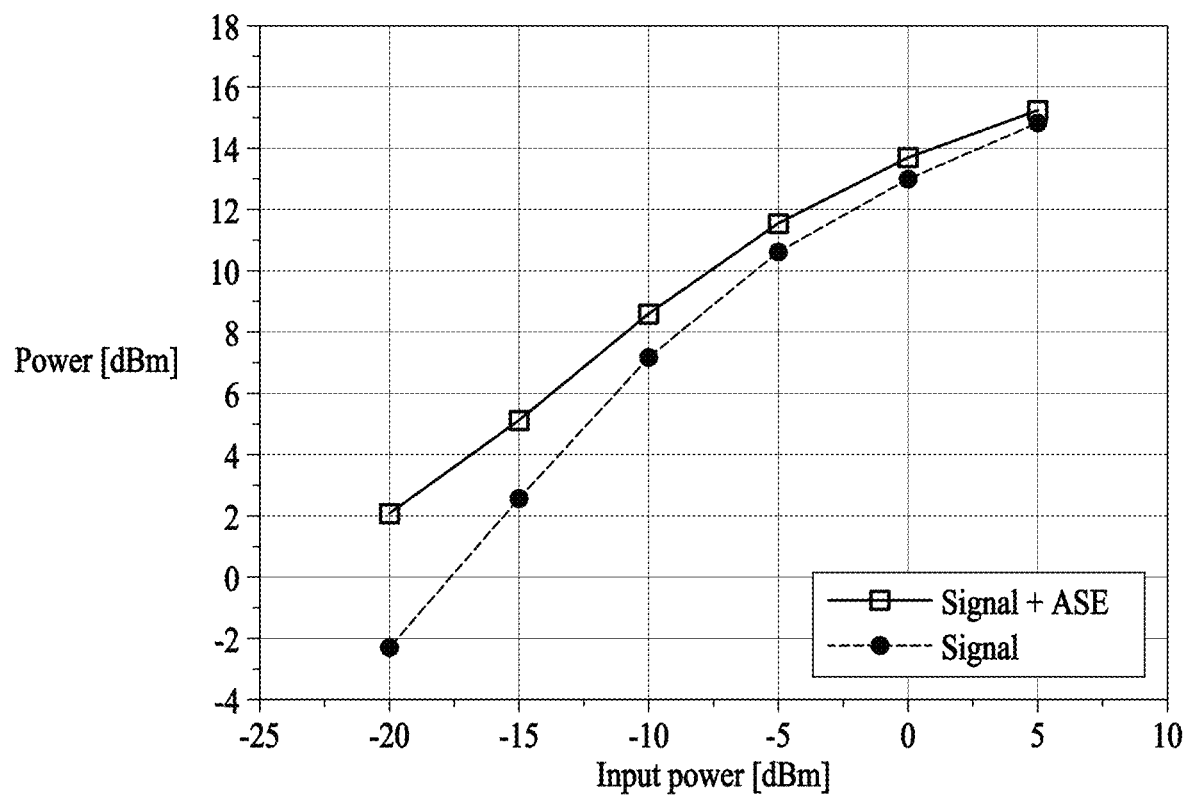
FIG. 5 is a diagram illustrating results of measuring a first optical power (input optical signal power+amplified spontaneous emission (ASE) noise power) and a second optical power (input optical signal power) based on a change in an input optical signal of an SOA according to an example embodiment.

FIG. 5 is a diagram illustrating results of measuring a first optical power (input optical signal power+ASE noise power) and a second optical power (input optical signal power) based on a change in an input optical signal of an SOA according to an example embodiment.

Referring to FIG. 5, it can be seen that a difference between a measured value of the first optical power and a measured value of the second optical power decreases as an optical power of the input optical signal inputted into the SOA 115 increases, and the two measured values are almost similar with respect to an input optical signal with an optical power power of 5 dBm. This is because the power of the ASE noise decreases as the gain of the SOA 115 is saturated.

Figure 6:
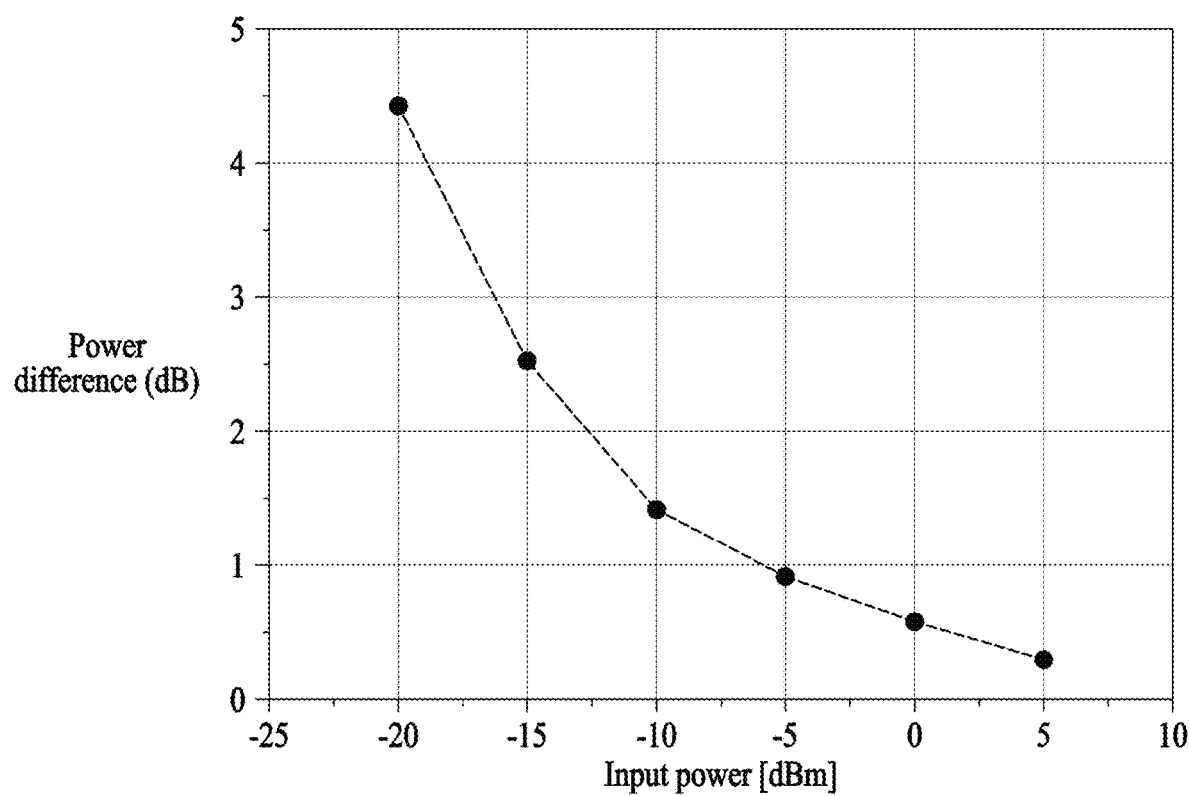
FIG. 6 is a diagram illustrating a difference between a first optical power (input optical signal power+ASE noise power) and a second optical power (input optical signal power) based on a change in an input optical signal of an SOA according to an example embodiment.

FIG. 6 is a diagram illustrating a difference between a first optical power (input optical signal power+ASE noise power) and a second optical power (input optical signal power) based on a change in an input optical signal of an SOA according to an example embodiment.

The processor constituting the controller 116 according to example embodiments may derive gain saturation of the SOA 115 using the difference between the first optical power and the second optical power. For example, the processor may determine that the SOA 115 is operating in a linear gain section when the power difference is greater than or equal to 1 dB, and the processor may determine that a gain saturation degree of the SOA 115 is severe when the power difference is less than 0.5 dB.

Based on the gain saturation derived using the measurement result, the processor may control an optical output of the downlink optical transmitter 114 and operating conditions (for example, an operating current, temperature, and the like) of the SOA 115, thereby increasing a power budget of the optical network 100. In this case, a feedback loop or a look-up table may be used as a control method.

The components described in the example embodiments may be implemented by hardware components including, for example, at least one digital signal processor (DSP), a processor, a controller, an application-specific integrated circuit (ASIC), a programmable logic element, such as a field programmable gate array (FPGA), other electronic devices, or combinations thereof. At least some of the functions or the processes described in the example embodiments may be implemented by software, and the software may be recorded on a recording medium. The components, the functions, and the processes described in the example embodiments may be implemented by a combination of hardware and software.

The method according to example embodiments may be written in a computer-executable program and may be implemented as various recording media such as magnetic storage media, optical reading media, or digital storage media.

Various techniques described herein may be implemented in digital electronic circuitry, computer hardware, firmware, software, or combinations thereof. The techniques may be implemented as a computer program product, i.e., a computer program tangibly embodied in an information carrier, e.g., in a machine-readable storage device (for example, a computer-readable medium) or in a propagated signal, for processing by, or to control an operation of, a data processing apparatus, e.g., a programmable processor, a computer, or multiple computers. A computer program, such as the computer program(s) described above, may be written in any form of a programming language, including compiled or interpreted languages, and may be deployed in any form, including as a stand-alone program or as a module, a component, a subroutine, or other units suitable for use in a computing environment. A computer program may be deployed to be processed on one computer or multiple computers at one site or distributed across multiple sites and interconnected by a communication network.

Processors suitable for processing of a computer program include, by way of example, both general and special purpose microprocessors, and any one or more processors of any kind of digital computer. Generally, a processor will receive instructions and data from a read-only memory or a random-access memory, or both. Elements of a computer may include at least one processor for executing instructions and one or more memory devices for storing instructions and data. Generally, a computer also may include, or be operatively coupled to receive data from or transfer data to, or both, one or more mass storage devices for storing data, e.g., magnetic, magneto-optical disks, or optical disks. Examples of information carriers suitable for embodying computer program instructions and data include semiconductor memory devices, e.g., magnetic media such as hard disks, floppy disks, and magnetic tape, optical media such as compact disk read only memory (CD-ROM) or digital video disks (DVDs), magneto-optical media such as floptical disks, read-only memory (ROM), random-access memory (RAM), flash memory, erasable programmable ROM (EPROM), or electrically erasable programmable ROM (EEPROM). The processor and the memory may be supplemented by, or incorporated in special purpose logic circuitry.

In addition, non-transitory computer-readable media may be any available media that may be accessed by a computer and may include both computer storage media and transmission media.

Although the present specification includes details of a plurality of specific example embodiments, the details should not be construed as limiting any invention or a scope that can be claimed, but rather should be construed as being descriptions of features that may be peculiar to specific example embodiments of specific inventions. Specific features described in the present specification in the context of individual example embodiments may be combined and implemented in a single example embodiment. On the contrary, various features described in the context of a single embodiment may be implemented in a plurality of example embodiments individually or in any appropriate sub-combination. Furthermore, although features may operate in a specific combination and may be initially depicted as being claimed, one or more features of a claimed combination may be excluded from the combination in some cases, and the claimed combination may be changed into a sub-combination or a modification of the sub-combination.

Likewise, although operations are depicted in a specific order in the drawings, it should not be understood that the operations must be performed in the depicted specific order or sequential order or all the shown operations must be performed in order to obtain a preferred result. In a specific case, multitasking and parallel processing may be advantageous. In addition, it should not be understood that the separation of various device components of the aforementioned example embodiments is required for all the example embodiments, and it should be understood that the aforementioned program components and apparatuses may be integrated into a single software product or packaged into multiple software products.

The example embodiments disclosed in the present specification and the drawings are intended merely to present specific examples in order to aid in understanding of the present disclosure, but are not intended to limit the scope of the present disclosure. It will be apparent to those skilled in the art that various modifications based on the technical spirit of the present disclosure, as well as the disclosed example embodiments, can be made.

What is claimed is:

1. An optical network comprising:
   an optical transmission apparatus,
   wherein the optical transmission apparatus comprises:
   an optical transmitter configured to output an optical signal;
   a semiconductor optical amplifier (SOA) configured to amplify the optical signal outputted through the optical transmitter; and
   a controller configured to control the SOA to operate in a gain saturation region or a linear gain region depending on whether a forward error correction (FEC) function is used in the optical network,
   wherein the controller is configured to:
   control the SOA to operate in the gain saturation region when the FEC function is included and used in the optical network, and
   control the SOA to operate in the linear gain region when the FEC function is not included in the optical network.

2. The optical network of claim 1, wherein:
   the controller is configured to control an optical output of the optical transmitter and an operating condition of the SOA based on gain saturation of the SOA, the operating condition including an operating current and a temperature of the SOA, and
   the gain saturation of the SOA is determined based on amplified spontaneous emission (ASE) noise of the SOA.

3. An optical network comprising:
   an optical transmission apparatus,
   wherein the optical transmission apparatus comprises:
   an optical transmitter configured to output an optical signal;
   a semiconductor optical amplifier (SOA) configured to amplify the optical signal outputted through the optical transmitter; and
   a controller configured to control an optical output of the optical transmitter and an operating condition of the SOA, according to a gain saturation of the SOA, the operating condition including an operating current and a temperature of the SOA, and
   wherein the gain saturation of the SOA is determined based on amplified spontaneous emission (ASE) noise of the SOA,
   wherein the controller comprises:
   a first optical power meter configured to measure an optical power of a first optical signal outputted by distributing, through an optical distributer, an optical signal amplified through the SOA to include the ASE noise;
   an optical filter configured to filter a second optical signal other than the first optical signal outputted through the optical distributer;
   a second optical power meter configured to measure an optical power of the second optical signal from which the ASE noise is filtered by the optical filter; and
   a processor configured to determine the gain saturation of the SOA using the first optical power measured through the first optical power meter and the second optical power measured through the second optical power meter.

4. The optical network of claim 3, wherein the gain saturation of the SOA is determined using a difference between the first optical power and the second optical power.

5. The optical network of claim 3, wherein the controller is configured to decrease the optical output of the optical transmitter or increase the operating current of the SOA when the determined gain saturation of the SOA has a value less than a preset value.

6. The optical network of claim 3,
   wherein the controller is configured to control the optical output of the optical transmitter and the operating condition of the SOA according to the determined gain saturation of the SOA using a feedback loop or a look-up table.

7. An optical network comprising:
   an optical transmission apparatus,
   wherein the optical transmission apparatus comprises:
   an optical transmitter configured to output an optical signal;
   a semiconductor optical amplifier (SOA) configured to amplify the optical signal outputted through the optical transmitter; and
   a controller configured to control an optical output of the optical transmitter and an operating condition of the SOA, according to a gain saturation of the SOA, the operating condition including an operating current and a temperature of the SOA, and
   wherein the gain saturation of the SOA is determined based on amplified spontaneous emission (ASE) noise of the SOA,
   wherein the controller is configured to increase the optical output of the optical transmitter or decrease the operating current of the SOA when the determined gain saturation of the SOA has a value greater than or equal to a preset value.

* * * * *